US012613258B2

(12) United States Patent
Krayer et al.

(10) Patent No.: US 12,613,258 B2
(45) Date of Patent: Apr. 28, 2026

(54) HOUSING PART FOR A SENSOR

(71) Applicant: Balluff GmbH, Neuhausen a.d.F. (DE)

(72) Inventors: Thorsten Krayer, Stuttgart (DE); Paul Ludyga, Leinfelden-Echterdingen (DE); Peter Petrovics, Zirc (HU); Lukas Foll, Stuttgart (DE); Holger Haupt, Denkendorf (DE); Jurgen Schiller, Reutlingen (DE); Matthias Hofmann, Nurtingen (DE)

(73) Assignee: BALLUFF GMBH, Neuhausen ADF (DE)

( * ) Notice: Subject to any disclaimer, the term of this patent is extended or adjusted under 35 U.S.C. 154(b) by 140 days.

(21) Appl. No.: 18/537,231

(22) Filed: Dec. 12, 2023

(65) Prior Publication Data

US 2024/0201222 A1     Jun. 20, 2024

(30) Foreign Application Priority Data

Dec. 20, 2022     (DE) .......................... 102022134104.6

(51) Int. Cl.
| | |
|---|---|
| *G01R 1/04* | (2006.01) |
| *G01R 27/26* | (2006.01) |
| *G01R 31/28* | (2006.01) |
| *H05K 1/02* | (2006.01) |
| *F21V 8/00* | (2006.01) |

(52) U.S. Cl.
CPC ............ *G01R 1/04* (2013.01); *G01R 27/2611* (2013.01); *G01R 31/282* (2013.01); *H05K 1/0274* (2013.01); *G02B 6/0051* (2013.01); *H05K 2201/10106* (2013.01); *H05K 2201/10189* (2013.01)

(58) Field of Classification Search
CPC .... G01D 11/245; G01R 1/04; G01R 27/2611; H05K 2201/0999; B60W 2420/506; G06K 7/082
USPC ...................................................... 324/207.15
See application file for complete search history.

(56) References Cited

U.S. PATENT DOCUMENTS

| | | | | |
|---|---|---|---|---|
| 3,946,979 | A * | 3/1976 | Ehlebracht ........... | A47B 95/008 |
| | | | | 248/274.1 |
| 11,912,233 | B1 * | 2/2024 | Austria ................... | B60Q 9/00 |
| 2021/0066565 | A1 * | 3/2021 | Kawano ............... | H10H 20/857 |

FOREIGN PATENT DOCUMENTS

DE     102015119557 A1 *   5/2017   ............. G01D 11/26

OTHER PUBLICATIONS

Position Sensor And Method For Manufacturing The Same (Translation) (Year: 2002).*

* cited by examiner

*Primary Examiner* — Roberto Velez
(74) *Attorney, Agent, or Firm* — GableGotwals

(57) ABSTRACT

A housing part (10) for a sensor has a transparent, hollow base body which has a toothing (14) in the form of a straight-toothed gearwheel in a circular-cylindrical emission region on its lateral surface. A circuit board of the sensor is partially arranged in the housing part (10). The circuit board has at least one light source which faces the emission region.

5 Claims, 5 Drawing Sheets

HOUSING PART FOR A SENSOR

CROSS-REFERENCE TO RELATED APPLICATIONS

This United States application claims priority to German Patent Application No. DE 10 2022 134 104.6 filed 20 Dec. 2022, which is incorporated herein by reference.

The present invention relates to a housing part for a sensor. The present invention further relates to a sensor which has the housing part.

PRIOR ART

Inductive sensors usually have a tubular metal housing. A sensor element is arranged on an end face of the metal housing. Said sensor element is operated by means of integrated circuits on a circuit board that runs through the metal housing. In order to electrically contact this circuit board, the metal housing is completed by a plug connector on its end located opposite the sensor element, said plug connector electrically contacting the circuit board.

If information about a functional state of the sensor needs to be output optically, then it is necessary to provide openings in the housing through which light sources arranged on the circuit board can shine out of the housing. Such light displays are difficult to see, however. If several openings are provided, then several light sources must in some cases also be arranged on the circuit board. This also applies if different functions of the sensor are to be represented by different colours of a light display.

It is an object of the present invention to provide a housing part for a sensor, in particular for an inductive sensor, which enables an optical output of signals of a circuit board of the sensor to be seen clearly. A further object is to provide a sensor that has such a housing part.

DISCLOSURE OF THE INVENTION

This object is solved in the first aspect of the invention by a housing part for a sensor, in particular for an inductive sensor, said housing part having a transparent, hollow base body. Transparent is in particular understood to mean a base body that has a transmittance of at least 90% in the wavelength range of visible light. For example, the base body can consist of polycarbonate.

In a circular-cylindrical emission region, the base body has a toothing in the form of a straight-toothed gearwheel on its lateral surface. A tooth height of the toothing preferably lies in the range of 0.10 mm to 0.40 mm, more preferably in the range of 0.20 mm to 0.30 mm. A length of the toothing along a longitudinal axis of the housing part preferably lies in the range of 2 mm to 7 mm, more preferably in the range of 3 mm to 5 mm. This emission region is provided to receive light from the hollow interior of the housing part and to transmit said light to the exterior of the housing part. It has been determined that a transparent toothing in the form of a straight-toothed gearwheel reflects light hitting the toothing from within such that it is partially emitted outwards and partially runs 360 degrees around the toothing, such that irradiating points on the emission region with a single light source from the cavity is sufficient to light up the entire circular-cylindrical emission region. The housing part thus makes it possible to create an annular, light-emitting region on the exterior of the housing part with only a single light source in the interior of the housing part, said annular, light-emitting region emitting light radially from the housing part, such that this light signal can be clearly seen from all sides of the housing part.

This effect can be improved even further if, in a preferred embodiment of the housing part, the base body has light-diffusing properties. In principle, this could be achieved by forming the base body from an opaque plastic. Opaque plastics only have a low transmittance, however. For this reason, the base body preferably contains at least one light-diffusing filler. In principle, this filler could be a dye. However, dyes also significantly reduce the transmittance of the base body. The filler is thus more preferably glass beads. The latter do not reduce the transmittance of the base body or reduce it only to an insignificant extent. The glass beads most preferably respectively have a diameter of a maximum of 1 μm.

In order to also guarantee that light emission is also clearly visible at the edges of the toothing, it is further preferred that the toothing is delimited on the lateral surface by a rough structure, in particular a textured structure. This means that the annular gearwheel of the toothing respectively borders a ring of the rough structure along a longitudinal axis of the housing part in both directions. The rough structure in particular has a surface roughness which lies in the range of 0.80 μm to 1.60 μm. The surface roughness is understood to mean the arithmetic mean roughness value Ra of the surface according to the standard DIN EN ISO 4287:2010.

It is further preferred that the toothing has at least one tooth gap, through which the rough structure extends, such that the two rings of the rough structure are connected to each other through the tooth gap. In a more preferred embodiment, the toothing has exactly one such tooth gap. This tooth gap is particularly suitable for arrangement under this one light source in the interior of the housing part, such that light emitted from the light source has its highest intensity at the tooth gap and is continuously reflected clockwise and anticlockwise around the toothing by said tooth gap. In another more preferred embodiment, the toothing has two tooth gaps located opposite each other. If the sensor has two light sources, one light source can respectively be arranged under each tooth gap. If the sensor has only one light source, one light source can be arranged under one tooth gap. A stiffening bar can be arranged under the other tooth gap, said stiffening bar running along a longitudinal axis of the base body and being formed as one part with the latter. The stiffening bar increases the bending strength of the base body. This is advantageous if a connecting cable is attached to the base body. In addition, the stiffening bar can serve as an insertion block, in order to ensure that a circuit board can only be inserted into the base body in one position. Two tooth gaps located opposite each other additionally allow the base body to be easily manufactured in an injection moulding method, as they each flatten the toothing, and thus make a separation of an ejector side and a nozzle side of an injection mould easier.

In order to effectively couple the light emitted by a light source in the interior of the housing part into the base body and to transmit said light to the toothing, it is preferred that a coupling element having a V-shaped cross-section is arranged on an interior wall of the emission region. In particular, this coupling element is arranged under the tooth gap of the toothing, and preferably corresponds to at least 75% of the length of the toothing.

In a second aspect, the invention relates to a sensor which has the housing part. This sensor is in particular an inductive sensor. A circuit board is partially arranged in the hollow base body of the housing part. At least one light source, in particular exactly one light source, is arranged on the circuit board and faces the emission region. Light emitted by the light source hits the inside of the base body in the emission region and is transmitted from the latter to the toothing and partially to rough structure which is optionally present.

It is preferred that the light source has at least two colours. In particular, the light source is designed as an LED that has two colours. Using the housing part according to the invention, this embodiment has the advantage that it is possible to emit light in at least three different colours in the emission region of the housing part by means of a light source which has two colours via additive mixing, and thus to display at least three different operating states of the sensor. If the light source is controlled such that it only emits light in one of its base colours, said light is emitted in the emission region to the exterior of the housing part. If, however, the light source is controlled such that it simultaneously emits light in several colours, the toothing of the emission region has the advantage that it mixes these colours so effectively that the mixed colour is seen by an observer from all possible observation angles. The possibility thus arises of displaying further operating states of the sensor by means of further colours without the danger arising of only one of the colours emitted by the light source, and thus an incorrect operating state, being incorrectly recognised from individual observation angles.

If the housing part has a coupling element, the light source preferably faces the coupling element.

In principle, it is also possible that the sensor has several light sources. These light sources are in particular arranged on two different sides of the circuit board. Two light sources can fulfil different functions. The function of the light source that has two colours can be replaced with two single-colour light sources. It can finally also be provided that two multi-coloured light sources, which respectively emit light of the same colours, can be operated simultaneously. Light then only needs to run around the toothing by 180 degrees to illuminate the entire emission region, so that even more homogeneous circumferential illumination can thus be generated. In this embodiment of the sensor, it can in particular be provided that the toothing has two tooth gaps which are located opposite each other. It can further be provided that one coupling element is respectively arranged under each of these tooth gaps.

While the circuit board is partially arranged in the housing part, it is preferable that another part of the circuit board is arranged in a housing pipe. This housing pipe is in particular a metal pipe, on the end facing away from the housing part of which a sensor element, in particular an inductive sensor element, is connected to the circuit board. The diameter of the housing pipe corresponds in particular to the diameter of a conventional metal housing for the sensor element used. The housing part is preferably connected to the housing pipe by means of a connecting region.

For electrical contact of the circuit board, the latter preferably has electrical plug contacts. The latter are arranged in a plug region of the housing part. The emission region is arranged between the plug region and the connecting region. The plug contacts are thus located on the end of the sensor which faces away from the housing pipe, and thus also from the sensor element. A closing element, which is in particular formed in the shape of a disc, is preferably arranged in the housing part, and has openings through which the plug contacts extend. The circuit board abuts in particular on the closing element.

BRIEF DESCRIPTION OF THE DRAWINGS

Exemplary embodiments of the invention are depicted in the drawings and are explained in more detail in the following description.

FIG. 1b shows an isometric view of the housing part according to FIG. 1a.

FIG. 2 shows a cross-sectional depiction of the housing part along the line II-II in FIG. 1a.

EXEMPLARY EMBODIMENTS OF THE INVENTION

Figure 1A:
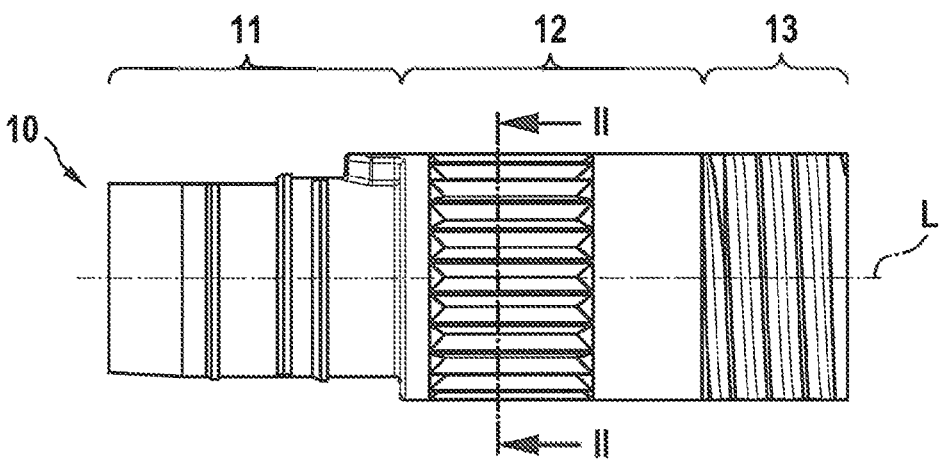
FIG. 1a shows a side view of a housing part according to an exemplary embodiment of the invention.
Figure 1B:
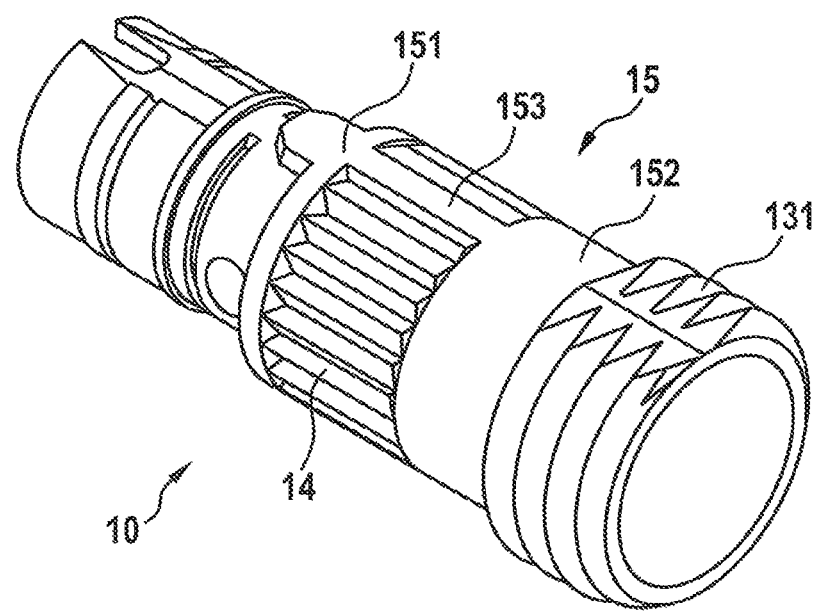

In FIGS. 1a and 1b, a housing part 10 according to an exemplary embodiment of the invention is depicted. The latter consists for example of a polycarbonate, which contains a light-diffusing filler (ALCOM® PC LD of Albis Plastic GmbH, Germany). The housing part 10 has a connecting region 11, an emission region 12 and a plug region 13 one after the other along its longitudinal axis L. Each of these regions 11, 12, 13 respectively has a circular-cylindrical cross-section. The housing part 10 is hollow, and open on both of its ends. In the emission region 12, a toothing 14 in the form of a straight-toothed gearwheel with a tooth gap runs around the housing part 10. A length of the toothing along the longitudinal axis L is for example 4.5 mm. The toothing 14 is manufactured as one part with the housing part 10 from the polycarbonate in an injection moulding method. The surfaces of the toothing are polished. The emission region 12 further has a textured structure 15, in which the surface of the housing part 10 has been roughened after manufacture in the injection moulding method by means of a subsequent texturing method to a surface roughness e.g., of Ra=1.20 μm (corresponding to VDI 3400 REF 21). The textured structure 15 is sub-divided into a first region 151, which runs around the housing part 10 in an annular manner between the toothing 14 and the connecting region 11, a second region 152, which runs around the housing part 10 in an annular manner between the toothing 14 and the plug region 13, and a third region 153, which runs through the tooth gap of the toothing 14 and connects the first region 151 and the second region 152 of the textured region 15 to each other. In the plug region 13, the housing part 10 has an outer thread 131.

Figure 2:
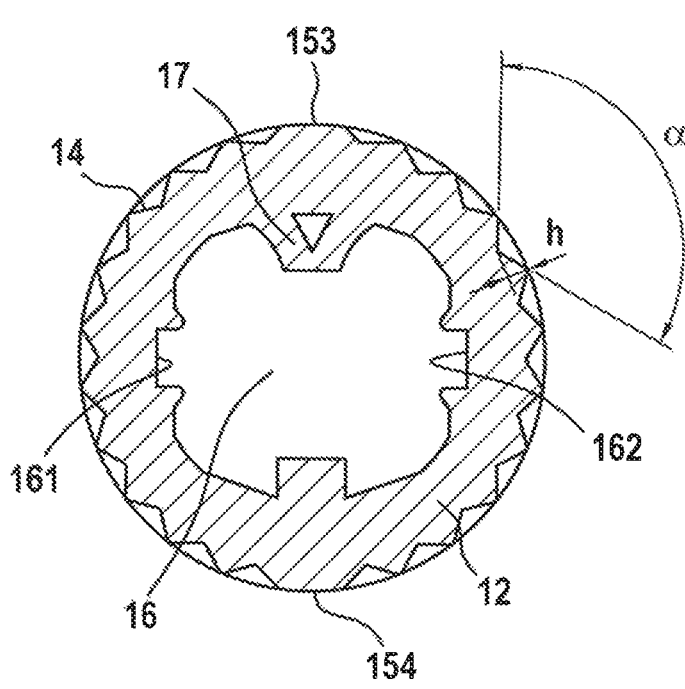

FIG. 2 shows a cross-sectional depiction of the emission region 12 in the region of the toothing 14. It can be seen that the teeth of the toothing 14 respectively have a tooth height h for example of 0.25 mm and that a tooth angle α is for example 120 degrees. The cavity 16, which extends through the housing part 10, is widened at two opposite positions by recesses 161, 162 in the base body of the housing part 10. These recesses 161, 162 respective extend over the entire length of the housing part 10. They are provided to make it possible to insert a circuit board into the cavity 16, and to precisely position the circuit board in the latter. A V-shaped coupling element 17 is formed as one part with the base body of the housing part 10 underneath the third region 153 of the textured structure 13 on the interior side of the base body of the housing part. It is provided to couple light which is emitted by a light source arranged on the circuit board into the emission region 12 of the housing part 10. Opposite the coupling element 17, a stiffening bar 163 formed as one part with the base body is arranged on the inside of the base body. Said stiffening bar runs along the longitudinal axis L of the housing part 10.

Figure 3A:
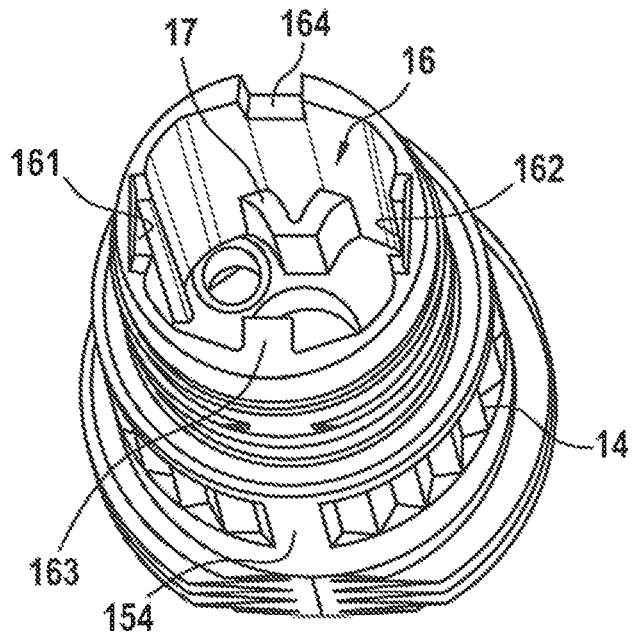
FIGS. 3a-c show isometric depictions of a housing part according to an exemplary embodiment of the invention.
Figure 3B:
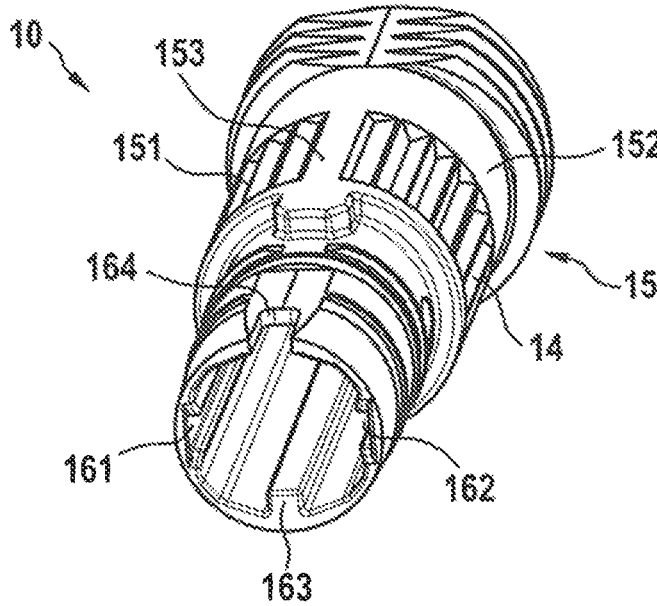
Figure 3C:
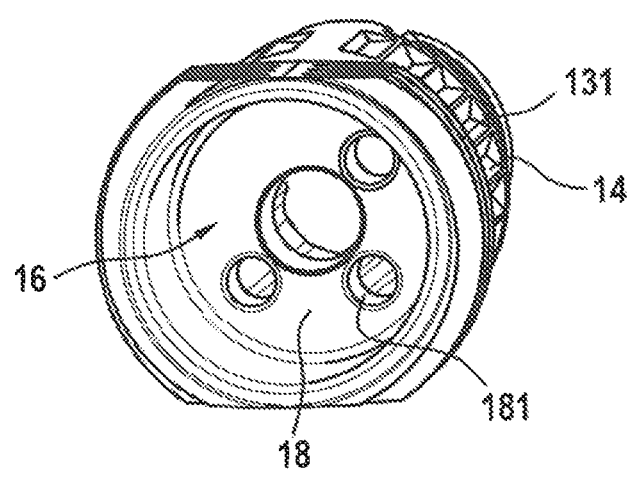

FIGS. 3a and 3b show a view into the cavity 16 of the housing part 10 through the opening of its connecting region 11. This opening is provided to insert a circuit board into the cavity 16. It can be seen that a recess 164 is provided in the edge of the connecting region 11, opposite the stiffening bar 163. FIG. 3c shows a view into the housing part 10 through the opening of its plug region 13. A disc-shaped closing element 18 is arranged in the cavity 16 and formed as one part with the latter. It has several openings 181, which are provided for receiving receive plug contacts.

Figure 4:
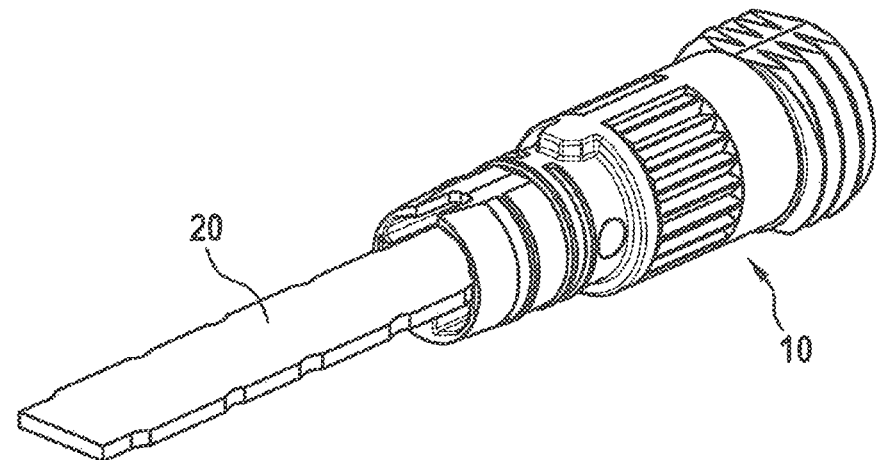
FIG. 4 shows a housing part according to an exemplary embodiment of the invention, into which a circuit board has been inserted, in a transparent isometric depiction.
Figure 5:
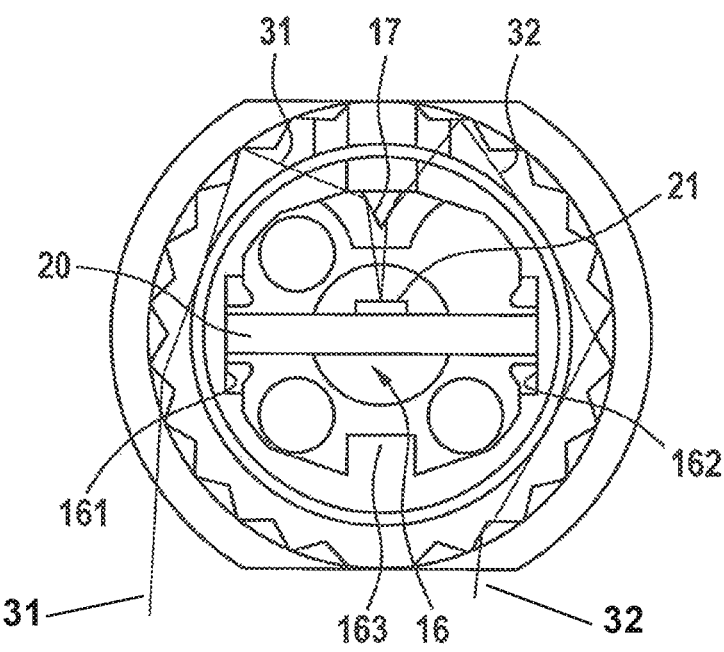
FIG. 5 shows a front view of the housing part according to FIG. 4.

FIG. 4 shows how the circuit board 20 has been inserted through the connecting region 11 into the cavity 16, wherein it is guided into the two recesses 161, 162 until it abuts on the closing element 18. It protrudes a little further out of the housing part 10. After the circuit board 20 is completely inserted into the housing part 10, a light source 21 in the form of an LED that has two colours, which is arranged on the circuit board 20, comes to rest under the coupling element 17, as depicted in FIG. 5. Light beams 31, 32, which are emitted by the light source 21, are first coupled by the coupling element 17 into the base body of the housing part 10 and then into the toothing 10 and reflected on the latter. In FIG. 5, only a single reflection path is represented for each of the two light beams 31, 32, which leads to light being emitted in the direction pointing downwards in FIG. 5. In practice, however, many different reflections take place, such that light is emitted radially in all directions around the housing part 10. The colours of the light source 21 are for example green and red. If the light source 21 simultaneously emits light in both colours, this light is mixed by the toothing 14 depending on the mixing ratio to form orange or yellow light.

Figure 6:
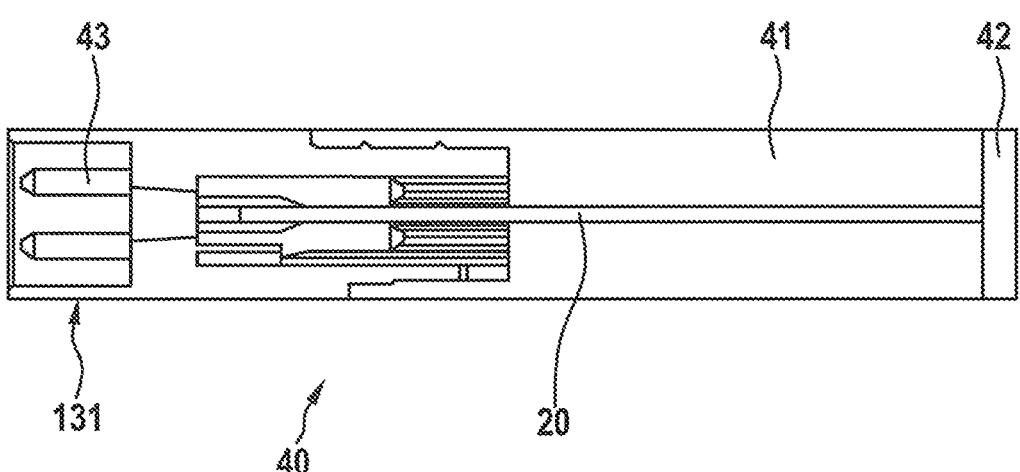
FIG. 6 shows a schematic sectional depiction of a sensor according to an exemplary embodiment of the invention.

FIG. 6 shows how the housing part 10 and the circuit board 20 are combined with further components to form a complete sensor 40 according to an exemplary embodiment of the invention. The connecting region 11 of the housing part 10 has been connected to a housing pipe 41. The circuit board 20 extends out of the connecting region 11 into the housing pipe 41 and is connected on its end (not depicted) facing away from the housing part 10 to an inductive sensor element 42. In order to contact the sensor element, several plug contacts 43 in the plug region 13 of the housing part 10 are guided through the openings 181 of the closing element 18 and connected to the circuit board 20. In this manner, it is possible to electrically contact the sensor 40 in its plug region 13 by means of a plug connection. The contact can be secured by screwing a plug connector to the housing part 10 by means of the outer thread 131.

The invention claimed is:

1. A sensor, said sensor comprising:
a circuit board partially arranged in a housing part, the housing part having a transparent, hollow base body having a toothing in the form of a straight-toothed gearwheel in a circular-cylindrical emission region on an outer lateral surface of the housing part, wherein the straight-toothed gearwheel respectively borders a ring of a rough structure along a longitudinal axis of the housing part in two directions and the rough structure extends through at least one tooth gap of the toothing,
wherein the circuit board has at least one light source which faces the circular-cylindrical emission region,
wherein the circuit board has electrical plug contacts arranged in a plug region of the housing part and extend through openings of a closing element formed as one part with the housing part, wherein the circular-cylindrical emission region is arranged between the plug region and a connecting region.

2. The sensor according to claim 1, wherein the light source has two colors.

3. The sensor according to claim 1 wherein the housing part has a coupling element having a V-shaped cross-section on an interior wall of the circular-cylindrical emission region and the at least one light source faces the coupling element.

4. The sensor according to claim 1, wherein the circuit board is partially arranged in a housing pipe, wherein the housing pipe is connected to the housing part by means of the connecting region of the housing part.

5. The sensor according to claim 1, wherein the hollow base body contains at least one light-diffusing filler.

* * * * *